(12) United States Patent
Terao et al.

(10) Patent No.: US 7,955,448 B2
(45) Date of Patent: Jun. 7, 2011

(54) ALLOY FOR HEAT DISSIPATION OF SEMICONDUCTOR DEVICE AND SEMICONDUCTOR MODULE, AND METHOD OF MANUFACTURING ALLOY

(75) Inventors: Hoshiaki Terao, Niigata (JP); Hideaki Kobiki, Tokyo (JP); Satoshi Uenosono, Tokyo (JP)

(73) Assignees: JFE Precision Corporation, Niigata-shi, Niigata (JP); JFE Steel Corporation, Tokyo (JP)

( * ) Notice: Subject to any disclaimer, the term of this patent is extended or adjusted under 35 U.S.C. 154(b) by 811 days.

(21) Appl. No.: 11/886,973

(22) PCT Filed: Oct. 5, 2005

(86) PCT No.: PCT/JP2005/018741
§ 371 (c)(1),
(2), (4) Date: Sep. 21, 2007

(87) PCT Pub. No.: WO2006/112063
PCT Pub. Date: Oct. 26, 2006

(65) Prior Publication Data
US 2009/0053090 A1 Feb. 26, 2009

(30) Foreign Application Priority Data
Apr. 15, 2005 (JP) ................................. 2005-119104

(51) Int. Cl.
*C22C 27/06* (2006.01)
*C22C 30/02* (2006.01)
(52) U.S. Cl. ........ 148/411; 148/419; 148/432; 420/428; 420/495; 420/587; 420/588
(58) Field of Classification Search ................... 148/407, 148/411–414, 432, 435, 553, 554, 668, 679, 148/682–686, 419; 419/27, 29; 420/428, 469, 495
See application file for complete search history.

(56) References Cited

U.S. PATENT DOCUMENTS
3,574,001 A * 4/1971 Ence .............................. 148/411
(Continued)

FOREIGN PATENT DOCUMENTS
EP 0 681 035 A2 11/1995
(Continued)

OTHER PUBLICATIONS
J.R. Davis, "ASM Handbook: Copper and Copper Alloys", *ASM Specialty Handbook: Copper and Copper Alloys, ASM International*, pp. 159-161 (2001).

*Primary Examiner* — George Wyszomierski
*Assistant Examiner* — Mark L Shevin
(74) *Attorney, Agent, or Firm* — Holtz, Holtz, Goodman & Chick PC

(57) ABSTRACT

It is an object to provide an inexpensive alloy for heat dissipation having a small thermal expansion coefficient as known composite materials, a large thermal conductivity as pure copper, and excellent machinability and a method for manufacturing the alloy. In particular, since various shapes are required of the alloy for heat dissipation, a manufacturing method by using a powder metallurgy method capable of supplying alloys for heat dissipation, the manufacturing costs of which are low and which take on various shapes, is provided besides the known melting method. The alloy according to the present invention is a Cu—Cr alloy, which is composed of 0.3 percent by mass or more, and 80 percent by mass or less of Cr and the remainder of Cu and incidental impurities and which has a structure in which particulate Cr phases having a major axis of 100 nm or less and an aspect ratio of less than 10 are precipitated at a density of 20 particles/$\mu m^2$ in a Cu matrix except Cr phases of more than 100 nm.

10 Claims, 9 Drawing Sheets

U.S. PATENT DOCUMENTS

| | | | |
|---|---|---|---|
| 4,822,560 A | * | 4/1989 | Oyama et al. .................. 420/470 |
| 5,798,008 A | | 8/1998 | Nogami et al. |
| 6,107,582 A | | 8/2000 | Okutomi et al. |

FOREIGN PATENT DOCUMENTS

| | | |
|---|---|---|
| EP | 0 903 760 A2 | 3/1999 |
| JP | 59-141247 A | 8/1984 |
| JP | 63-128158 * | 5/1988 |
| JP | 63-149344 A | 6/1988 |
| JP | 03-158431 A | 7/1991 |
| JP | 04-198439 A | 7/1992 |
| JP | 07-258804 A | 3/1994 |
| JP | 07-268573 A | 3/1994 |
| JP | 06-235035 A | 8/1994 |
| JP | 07-258804 * | 10/1995 |
| JP | 10-008166 A | 1/1998 |
| JP | 2000-208685 A | 7/2000 |
| JP | 2000-239762 A | 9/2000 |
| JP | 2002-212651 A | 7/2002 |
| JP | 2002-309325 A | 10/2002 |

* cited by examiner

500nm (a)

(b)

US 7,955,448 B2

ALLOY FOR HEAT DISSIPATION OF SEMICONDUCTOR DEVICE AND SEMICONDUCTOR MODULE, AND METHOD OF MANUFACTURING ALLOY

This application is the United States national phase application of International Application PCT/JP2005/018741 filed Oct. 5, 2005.

TECHNICAL FIELD

The present invention relates to an alloy for heat dissipation to be used for promptly diffusing the heat generated from electric components, e.g., semiconductor chips and semiconductor devices, mounted on electronic apparatuses, and a method for manufacturing the alloy for heat dissipation. In particular, it relates to an alloy for heat dissipation formed from a chromium-containing copper alloy and a method for manufacturing the alloy.

BACKGROUND ART

A semiconductor chip or a semiconductor device is used while being mounted on an alloy for heat dissipation in order to prevent an abnormal rise in temperature due to heat generation during operation. The alloy for heat dissipation may be referred to as a heat sink or a heat spreader. Examples of methods for mounting the semiconductor chip or the semiconductor device on the alloy for heat dissipation include (1) a method of soldering or brazing directly, (2) a method of soldering or brazing via ceramic, e.g., aluminum nitride (AlN), and (3) a method of mounting with a thermal conductive resin, e.g., silicone grease, interposed therebetween. In every case, the alloy for heat dissipation is required to have a high thermal conductivity in order to promptly dissipate the heat generated from the semiconductor chip or the semiconductor device during operation.

In the methods of the above-described items (1) and (2), the semiconductor chip or aluminum nitride substrate is firmly mounted on the alloy for heat dissipation. Therefore, in order to prevent, for example, cracking of solder layer and warpage, an alloy for heat dissipation having a thermal expansion coefficient close to that of the semiconductor and, furthermore, that of the ceramic, e.g., aluminum nitride, is required.

It is difficult to achieve the above-described characteristics by a simple raw material. Heretofore, in general, so-called composite materials, in which a material having a small thermal expansion coefficient and a material having a large thermal conductivity are combined, have been used frequently as the alloy for heat dissipation. In Patent Document 1, metal-metal based composite materials, e.g., tungsten-copper (W—Cu) and molybdenum-copper (Mo—Cu), have been proposed. The above-described proposal has been made because tungsten and molybdenum have low thermal expansion coefficient, on the other hand, copper has a high thermal conductivity. In Patent Document 2, ceramic-metal based composite materials, e.g., silicon carbide-aluminum (SiC—Al) and cuprous oxide-copper ($Cu_2O$—Cu), are disclosed. Furthermore, in Patent Document 3, metal-metal based composite materials, e.g., chromium-copper (Cr—Cu) and niobium-copper (Nb—Cu), have been proposed.

On the other hand, in the case where the semiconductor device is mounted on the heat dissipation material with a thermal conductive resin, e.g., silicone grease, interposed therebetween, the difference in thermal expansion between the semiconductor chip or aluminum nitride substrate and the heat dissipation plate is absorbed by the thermal conductive resin and, thereby, inexpensive alloys for heat dissipation, e.g., pure copper exhibiting large thermal expansion, can be used. However, since the thermal conductivity of the resin is small as compared with the solder or braze, it is undesirable to use for the semiconductor chip and semiconductor device having a high heating value.

The chromium copper (JIS-Z3234) alloy used as an electrode material for welding from long ago is a precipitation hardened alloy, and is also used as an alloy for heat dissipation in place of the pure copper in the use in which strength is required. However, the thermal expansion coefficient thereof is substantially the same as that of the pure copper and is a high $17.6 \times 10^{-6}$/K. Consequently, it cannot be applied as an alloy for heat dissipation to be subjected to soldering or brazing.

Patent Document 1: Japanese Examined Patent Application Publication No. 5-38457

Patent Document 2: Japanese Unexamined Patent Application Publication No. 2002-212651

Patent Document 3: Japanese Unexamined Patent Application Publication No. 2000-239762

DISCLOSURE OF INVENTION

As described above, it is desirable that the semiconductor chip or the semiconductor device having a high heating value is mounted on the heat dissipation plate by soldering or brazing.

The alloy for heat dissipation including the metal-metal based composite material, e.g., tungsten-copper and molybdenum-copper, proposed in Patent Document 1 has machinability in cutting work, press work, and the like. However, there is a problem in that the powders of tungsten and molybdenum, which are used for the materials, are expensive.

The ceramic-metal based composite materials, e.g., silicon carbide-aluminum and cuprous oxide-copper, proposed in Patent Document 2 have problems in that the hardness is high, the machinability is poor and, furthermore, a uniform plating treatment is difficult.

With respect to the copper alloy proposed in Patent Document 3, it is disclosed that the thermal expansion is reduced by increasing the aspect ratio of the Cr phase primarily crystallized in the copper parent phase during solidification. The second phase described in Patent Document 3 mainly refers to a primarily crystallized phase in solidification in a Cu—Cr system phase diagram shown in FIG. 1. On the other hand, in the present invention, a precipitated phase from solid solution by aging treatment is defined as a secondarily precipitated phase.

It is an object of the present invention to provide an inexpensive alloy for heat dissipation having a small thermal expansion coefficient as the above-described composite materials, high thermal conductivity, and excellent machinability and a method for manufacturing the alloy. In particular, since various shapes are required of the alloy for heat dissipation, a manufacturing method by using a powder metallurgy method capable of supplying alloys for heat dissipation, the manufacturing costs of which are low and which take on various shapes, is also provided besides the known melting method.

In the present invention, the research has been conducted while the start point has been a Cu—Cr alloy (Cr is 3 percent by mass or less), which has been previously in practical use as a contact alloy. According to the Cu—Cr system phase diagram shown in FIG. 1, Cr is about 1.5 percent by mass at an eutectic point, and is about 40 percent by mass at a monotectic point. Therefore, the research has been conducted while the alloys have been classified into alloys containing 3 percent by mass or less of Cr, alloys containing more than 3 percent by mass, and 40 percent by mass or less of Cr, and alloys containing more than 40 percent by mass of Cr.

As a result, it has been made clear that in every case, when the alloy has been worked into a predetermined shape, subjected to a solution heat treatment, cooled slowly, and aged at various temperatures, the thermal expansion coefficient has been decreased sharply in a range of 500° C. to 750° C. Consequently, it has been found that an alloy having a small thermal expansion coefficient has been produced.

A first aspect of the present invention is a Cu—Cr alloy characterized by containing 0.3 percent by mass or more, and 80 percent by mass or less of Cr and the remainder of Cu and incidental impurities and having a structure in which particulate Cr phases having a major axis of 100 nm or less and an aspect ratio of less than 10 are precipitated at a density of 20 particles/$\mu m^2$ or more in a Cu matrix except Cr phases of 100 nm or more.

A second aspect of the present invention is a Cu—Cr alloy characterized by containing Cr and the remainder of Cu and incidental impurities, wherein the alloy has been worked into a predetermined shape by a melting method or a powder metallurgy method, subjected to infiltration and/or a solution heat treatment, cooled at a cooling rate of 600° C./min or less, and subjected to aging in a range of 500° C. or higher, and 750° C. or lower.

A third aspect of the present invention is a Cu—Cr alloy characterized by containing Cr and the remainder of Cu and incidental impurities, wherein the alloy has been molded into a predetermined shape by a powder metallurgy method, cooled at a cooling rate of 600° C./min or less after being subjected to sintering and/or infiltration, and subjected to aging in a range of 500° C. or higher, and 750° C. or lower.

A fourth aspect of the present invention is a Cu—Cr alloy characterized in that Cr is 0.3 percent by mass or more, and 3 percent by mass or less in the above-described Cu—Cr alloy.

A fifth aspect of the present invention is a Cu—Cr alloy characterized in that Cr is more than 3 percent by mass, and 40 percent by mass or less in the above-described Cu—Cr alloy.

A sixth aspect of the present invention is a Cu—Cr alloy characterized in that Cr is more than 40 percent by mass, and 80 percent by mass or less in the above-described Cu—Cr alloy.

A seventh aspect of the present invention is a Cu—Cr alloy characterized in that the above-described Cu—Cr alloy further contains 0.1 percent by mass or more, and 2.0 percent by mass or less in total of at least one type selected from Ti, Zr, Fe, Co, and Ni.

An eighth aspect of the present invention is a Cu—Cr alloy characterized in that the temperature of the above-described solution heat treatment is a temperature within the range of 900° C. or higher, and 1,050° C. or lower.

A ninth aspect of the present invention is a member for heat dissipation characterized by including the above-described Cu—Cr alloy.

A tenth aspect of the present invention is a method including the step of using the above-described Cu—Cr alloy as a member for heat dissipation.

An eleventh aspect of the present invention is a method for manufacturing a Cu—Cr alloy containing 0.3 percent by mass or more, and 80 percent by mass or less of Cr and the remainder of Cu and incidental impurities, the manufacturing method characterized by including the steps of performing melting and casting or melting, casting, and working; and aging the resulting alloy at a temperature within the range of 500° C. or higher, and 750° C. or lower.

A twelfth aspect of the present invention is a method for manufacturing a Cu—Cr alloy containing 0.3 percent by mass or more, and 80 percent by mass or less of Cr and the remainder of Cu and incidental impurities, the manufacturing method characterized by including the steps of mixing and sintering powders of Cu and Cr; and aging the resulting sintered compact at a temperature within the range of 500° C. or higher, and 750° C. or lower.

A thirteenth aspect of the present invention is a method for manufacturing a Cu—Cr alloy containing 0.3 percent by mass or more, and 80 percent by mass or less of Cr and the remainder of Cu and incidental impurities, the manufacturing method characterized by including the steps of sintering a Cr powder alone or mixed powders of Cu and Cr; infiltrating copper into the resulting sintered compact to produce a infiltrated compact; and aging the resulting infiltrated compact at a temperature within the range of 500° C. or higher, and 750° C. or lower.

A fourteenth aspect of the present invention is a method for manufacturing a Cu—Cr alloy, characterized in that the above-described Cu—Cr alloy further contains 0.1 percent by mass or more, and 2.0 percent by mass or less in total of at least one type selected from Ti, Zr, Fe, Co, and Ni.

A fifteenth aspect of the present invention is a method for manufacturing a Cu—Cr alloy, characterized in that the above-described Cu—Cr alloy is further subjected to a solution heat treatment at a temperature within the range of 900° C. or higher, and 1,050° C. or lower before the above-described aging.

A sixteenth aspect of the present invention is a method for manufacturing a Cu—Cr alloy, characterized in that the above-described Cu—Cr alloy is cooled at a cooling rate of 600° C./min or lower after the above-described solution heat treatment.

The Cu—Cr alloy according to the present invention allows a high thermal conductivity and a low thermal expansion coefficient, which are suitable for a heat dissipation plate for a semiconductor device and a semiconductor module, to become compatible with each other, and can be produced more economically as compared with a known tungsten-copper based or molybdenum-copper based alloy for heat dissipation of a semiconductor device and a semiconductor module. Furthermore, uniform plating can be performed and excellent machinability is exhibited. The alloy for heat dissipation according to the present invention is a Cu—Cr alloy having a thermal expansion coefficient of $9.0 \times 10^{-6}$ to $16.7 \times 10^{-6}$/K in a range from room temperature to 200° C. and a thermal conductivity of 134 to 350 W/(m·K), as shown, in FIG. 8.

BEST MODE FOR CARRYING OUT THE INVENTION

The embodiments of the present invention will be described below with reference to the examples.

EXAMPLE 1

A heat dissipation plate was prepared from a Cu—Cr alloy according to the present invention, and the characteristics thereof were examined. With respect to the plate material according to the present invention, a Cu—Cr alloy containing 1.1 percent by mass of Cr was melted in a vacuum melting furnace, and was cast by using a casting mold into an ingot having a size of 80 mm×80 mm square and a weight of 30 kg. Thereafter, the resulting ingot was hot-worked at a rolling temperature of 950° C., and was cold-rolled after an oxide film was removed so as to be worked into a plate material of about 3 mm.

Furthermore, the plate material was press-formed so as to be finished into a heat dissipation plate of 150×150×3 mm, kept at 1,000° C. for 30 minutes so as to be subjected to a solution heat treatment, and was cooled at an average cooling rate of 600° C./min (hereafter referred to as quench) or at an average cooling rate of 30° C./min (hereafter referred to as slow cooling) so as to produce a heat dissipation plate in order to examine the influence of the cooling rate. Here, the average cooling rate refers to an average cooling rate in a cooling process from a keeping temperature to 100° C. after the sintering treatment or in the infiltration or in the solution heat treatment. Furthermore, a disk-shaped test piece having a diameter of 10 mm and a thickness of 3 mm to be used for Vickers hardness measurement was cut from the heat dissipation plate, and was kept in an argon gas at a temperature within the range of 500° C. or higher, and 700° C. or lower for 60 minutes so as to be aged.

Figure 1:
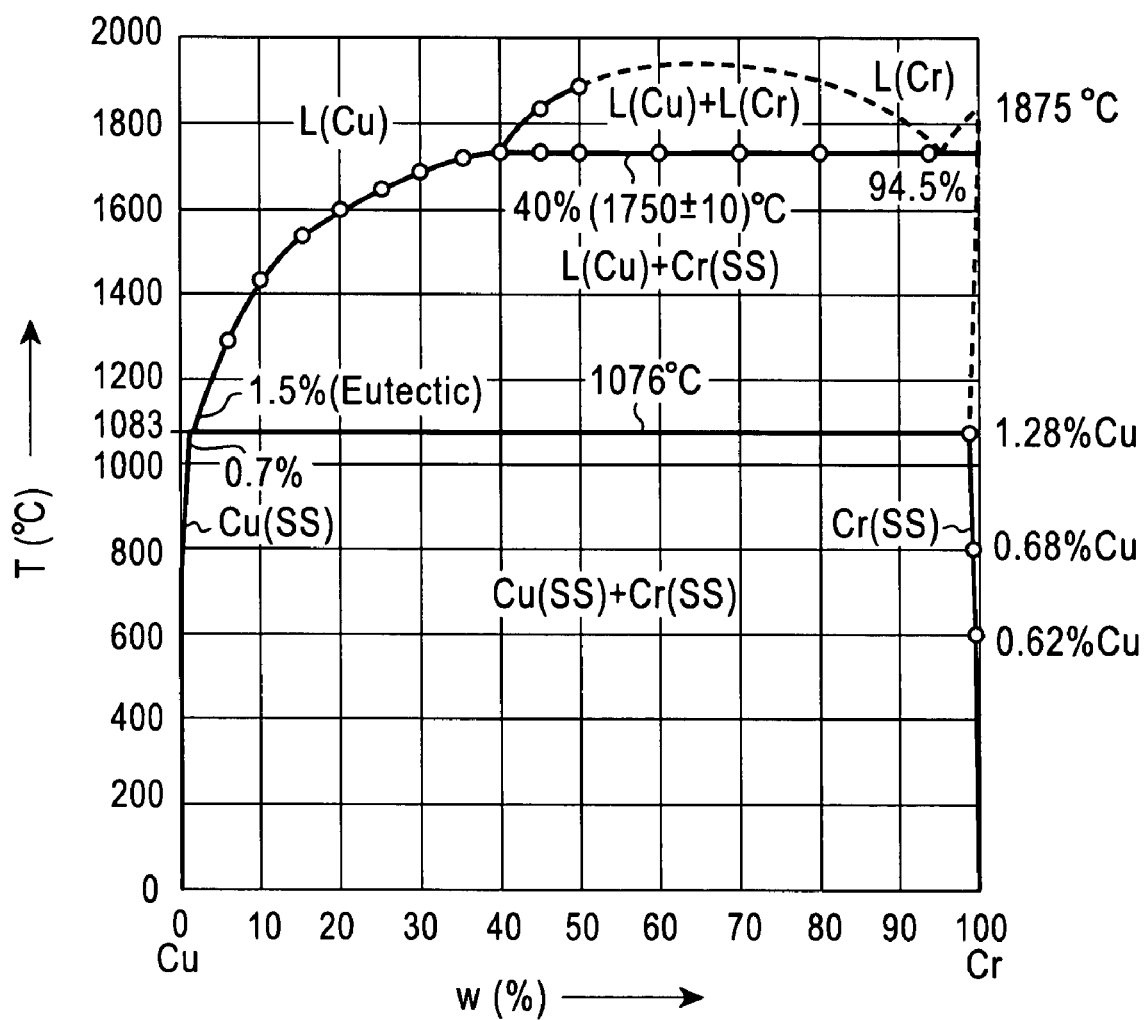
FIG. 1 is a phase diagram of a known Cu—Cr alloy.
Figure 2:
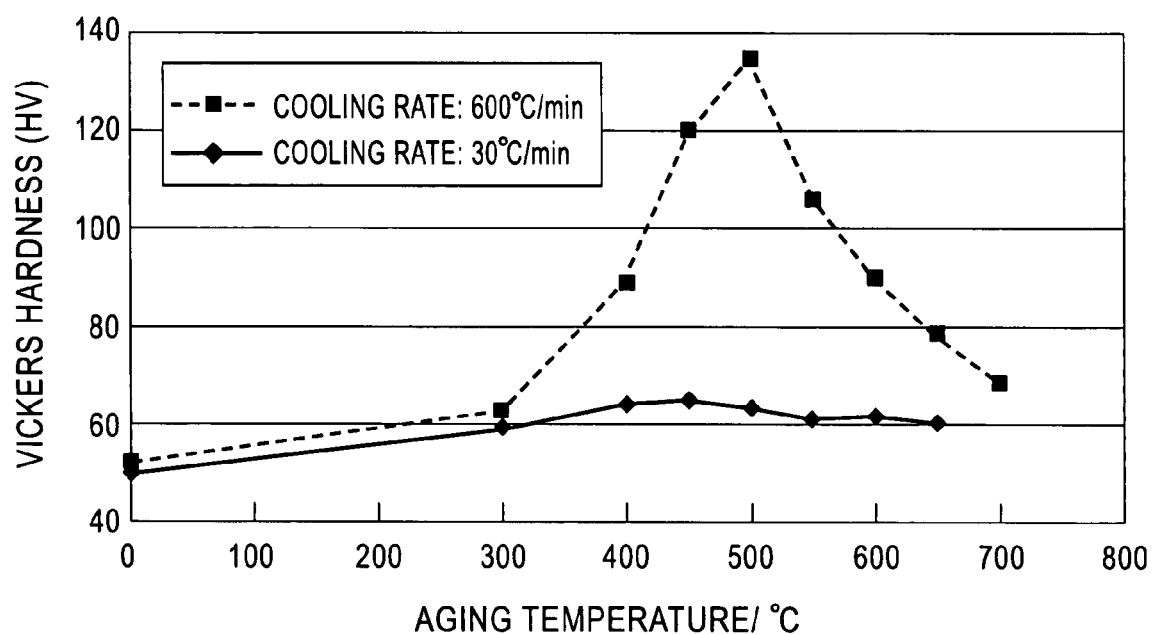
FIG. 2 is a diagram showing the relationship between the aging temperature and the Vickers hardness.

FIG. 2 shows the aging temperature dependence of the Vickers hardness of the resulting test piece. The vertical axis of the diagram indicates the Vickers hardness, and the horizontal axis of the diagram indicates the aging temperature (° C.). The measurement results shown in FIG. 2 are the measurement results indicating the characteristic of the alloy produced by the method for manufacturing a heat dissipation plate according to the present invention. The characteristic of the alloy for heat dissipation resulting from slow cooling is indicated by a solid line, and that in the case of quench is indicated by a dotted line. In the diagram, 0° C. indicates the hardness before aging.

As shown in FIG. 2, when the Vickers hardness (JIS Z2244: 2003) of the test piece resulting from quenching is measured, the Vickers hardness before aging (0° C.) records 53. However, when the aging temperature is increased and the aging temperature reaches 500° C., the Vickers hardness records 135. Thereafter, as the aging temperature is increased, the Vickers hardness is decreased, and when the aging temperature reaches 700° C., the Vickers hardness records 70.

On the other hand, in the case of slow cooling, an increase of hardness due to the aging is small. After the slow cooling, the heat dissipation plate was cut into a disk-shaped test piece having a diameter of 10 mm and a thickness of 3 mm to be used for Vickers hardness measurement, and was kept in an argon gas at a temperature within the range of 500° C. or higher, and 700° C. or lower for 60 minutes so as to be aged.

Figure 3:
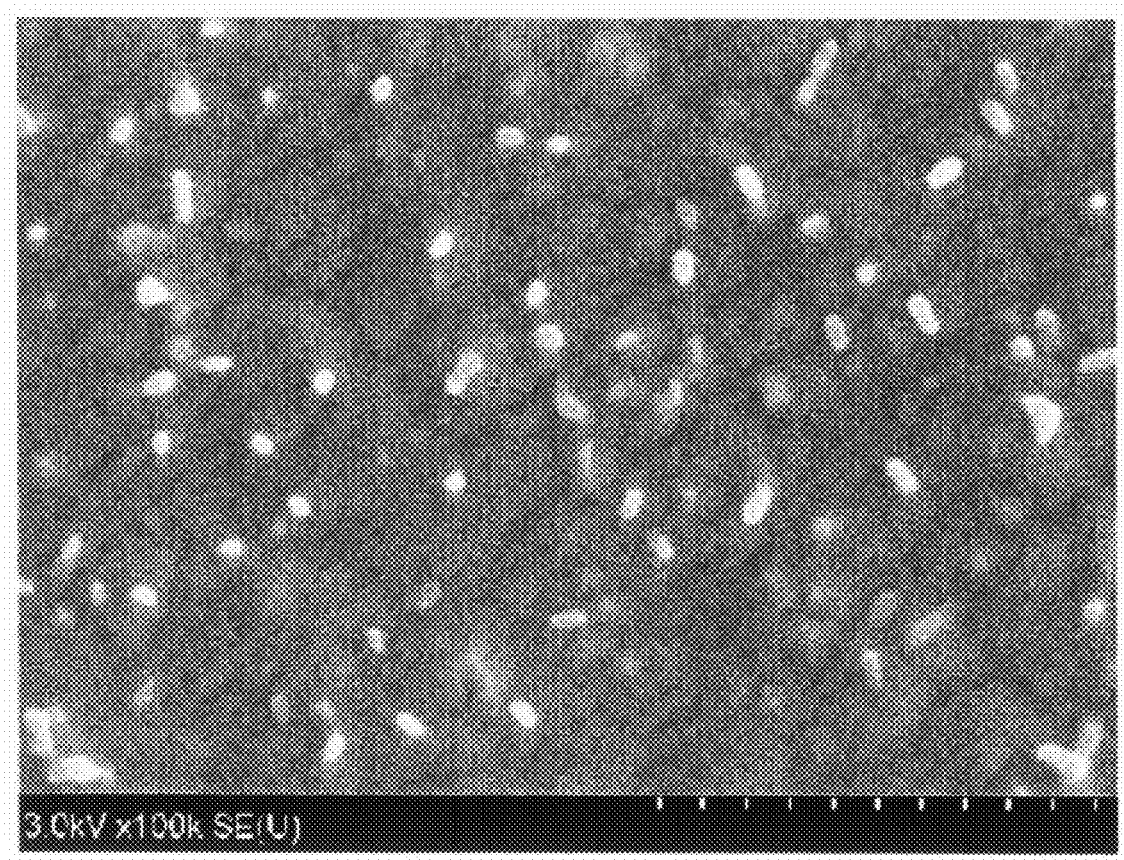
FIG. 3 is a photograph showing a cross section of an alloy for heat dissipation according to the present invention.
Figure 3:
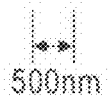

FIG. 3 shows a SEM (scanning electron microscope) photograph of a microstructure of a test piece aged at 550° C. among the slow-cooled Cu—Cr alloys produced by the above-described method. As is clear from FIG. 3, chromium is secondarily precipitated in a copper matrix containing solid solutions of about 0.3 to 1.5 percent by mass of Cr. The average particle diameter of this secondarily precipitated chromium is 26 nm (nanometer), the number of chromium particles having a major axis of 100 nm or less is 75 particles/$\mu m^2$ per unit area (hereafter referred to as precipitation density), and the aspect ratio is 5.6 at the maximum and 1.7 on the average. That is, chromium is precipitated at a nanometer level. The apparatus and the various conditions for taking this photograph are as described below. A picture-taking apparatus is FE-SEM, Model S-4800 produced by Hitachi, Ltd. With respect to the conditions for taking the photograph, the acceleration voltage is 3 kV, and the magnification is 100,000 times. The size of field of view is 1,270×890 nm. The etching condition is as described below. Immersion was performed in a solution, in which 10 g of potassium dichromate, 5 ml of sulfuric acid (96%), and 1 or 2 drops of hydrochloric acid are dissolved and mixed into 80 ml of distilled water, at room temperature for 3 to 15 seconds and, thereafter, water washing and drying were performed.

As shown in FIG. 2, when the Vickers hardness of the test piece produced by the method for manufacturing a slow-cooled alloy for heat dissipation in the present invention is measured, the Vickers hardness before aging (0° C.) records 51. However, when the aging temperature is increased and the aging temperature reaches 500° C., the Vickers hardness reaches no higher than 65. Thereafter, even when the aging temperature is increased, the Vickers hardness is hardly changed, and even when the aging temperature reaches 650° C., the Vickers hardness records no higher than 61. Although the reasons why the hardness is not increased, as described above, are not certain in detail, it is estimated that precipitation at an atomic level, which is a so-called GP zone (Guinier-Preston Zone), does not occur, this precipitation being believed generally to have an effect of hardening the Cu—Cr alloy in a range of 450° C. or higher, and 500° C. or lower, and in place of it, chromium at several tens of nanometers level is precipitated.

As described above, when the Vickers hardness at an aging temperature of 550° C. of the slow-cooled test piece produced by the manufacturing method according to the present invention is compared with that of the quenched test piece, the Vickers hardness of the quenched test piece is significantly higher than that of the slow-cooled test piece produced by the method for manufacturing an alloy for heat dissipation.

Figure 4:
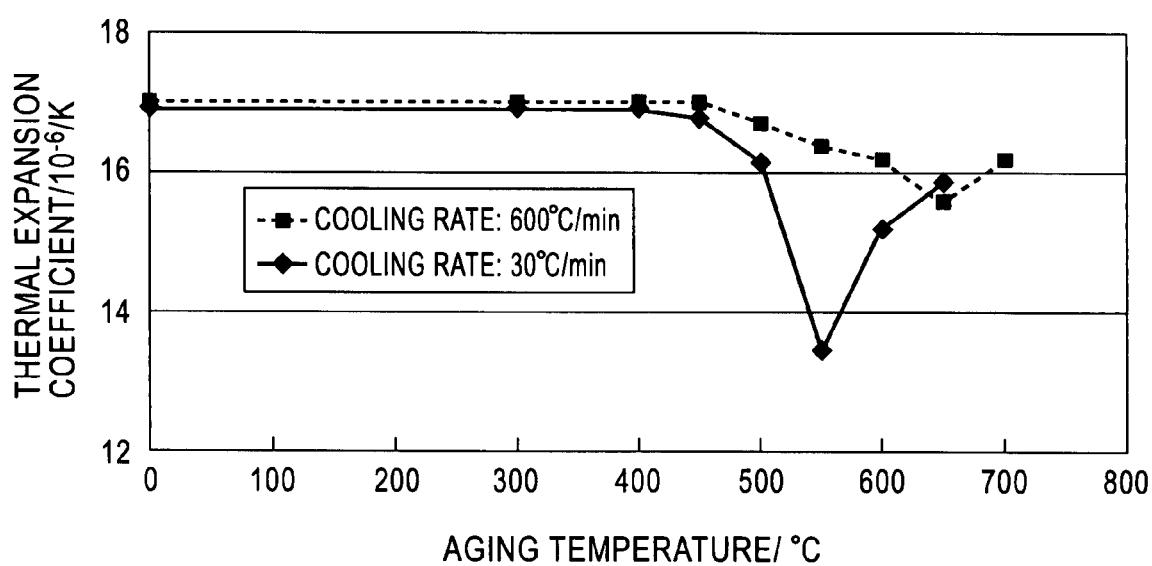
FIG. 4 is a diagram showing the relationship between the aging temperature and the thermal expansion coefficient.

FIG. 4 is a diagram showing the aging temperature dependence of the thermal expansion coefficient of the above-described test pieces. The vertical axis of the diagram indicates the thermal expansion coefficient, and the horizontal axis of the diagram indicates the aging temperature (° C.). The measurement results shown in FIG. 4 are the measurement results indicating the characteristics of the alloys produced by slow cooling and quenching. The method for manufacturing a heat dissipation material related to slow cooling is indicated by a solid line, and the example in the case of quenching is indicated by a dotted line.

As shown in FIG. 4, when the thermal expansion coefficient of the test piece resulting from slow cooling is measured, the thermal expansion coefficient before aging (0° C.) is $16.9 \times 10^{-6}$/K. However, when the aging temperature is increased and the aging temperature reaches 550° C., the thermal expansion coefficient is decreased to about $13.5 \times 10^{-6}$/K. Thereafter, as the aging temperature is increased, the thermal expansion coefficient is increased sharply, and when the aging temperature reaches 650° C., the thermal expansion coefficient reaches about $15.9 \times 10^{-6}$/K.

As described above, when the thermal expansion coefficient of the test piece aged at the temperature of 550° C., which is produced by slow cooling is compared with that of the test piece produced by quenching, the thermal expansion coefficient of the test piece produced by slow cooling is significantly smaller than that of the test piece produced by quenching. However, in both of the cases, a decrease in thermal expansion coefficient is observed. With respect to the thermal conductivity, when slow cooling is performed after the solution heat treatment, the thermal conductivity is improved to 345 W/mK at an aging temperature of 550° C., whereas it is 259 W/mK before aging.

EXAMPLE 2

A method for manufacturing a heat dissipation plate by sintering a metal chromium powder (hereafter referred to as a powder metallurgy method) will be described below in detail with reference to FIG. 5, FIG. 6, FIG. 7, and Table 1. The heat dissipation plate according to the present invention is basically a Cr—Cu metal-metal based composite material and is produced by aging within the range of 500° C. or higher, and 750° C. or lower. Basically, such a heat dissipation plate can also be produced by preparing a sintered compact of a metal chromium powder, infiltrating copper into the sintered compact, and performing aging within the range of 500° C. or higher, and 750° C. or lower.

Figure 6:
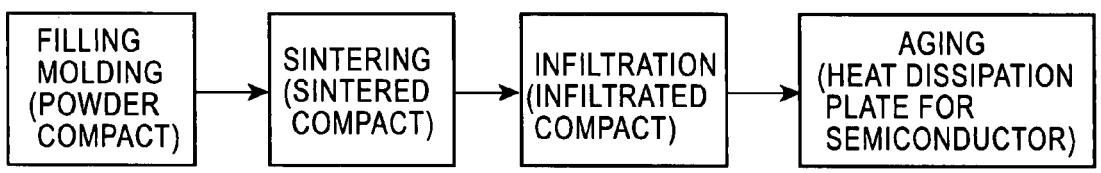
FIG. 6 is an explanatory diagram showing steps constituting a method for manufacturing an alloy for heat dissipation.
Figure 6:
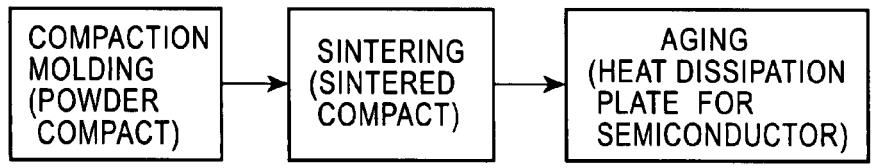

FIG. 6 shows the manufacturing process. As illustrated in FIG. 6 (a), the heat dissipation plate is produced through a molding step of filling the metal chromium powder into a mold to prepare a powder compact, a sintering step of sintering the resulting powder compact to prepare a sintered compact, an infiltration step of infiltrating copper into the sintered compact to prepare an infiltrated compact, and an aging step of aging the infiltrated compact. Alternatively, a solution heat treatment step may be performed before the above-described aging of the infiltrated compact. The present invention will be specifically described below following the process shown in FIG. 6 (a).

The metal chromium powder forms a sintered compact primarily composed of metal Cr and having voids in the molding and sintering step, and the sintered compact has a function of providing spaces which make the infiltration of copper possible.

Hereafter, a metal structure present when the molding and the sintering are completed is referred to as a phase A, and a metal structure formed by copper infiltration is referred to as a phase B. A part of chromium in the phase A is melted and dissolved into the phase B in the infiltration step, and primary crystallization of Cr occurs in the step of solidification after the infiltration. In this phase B after the solidification, solid solutions of about 0.3 to 1.5 percent by mass of Cr are present, and secondary precipitation occurs in the following aging step. Preferably, the above-described metal chromium powder has a purity of 99 percent by mass or more and a particle size of 250 μm or less (Sieving is performed based on JIS Z2510, and the numerical number indicates a nominal opening size shown in JIS Z8801-1. Hereafter, the same holds true.) is used.

The above-described sintered compact may contain 0.1 percent by mass or more, and 2.0 percent by mass or less in total of at least one type selected from titanium (Ti), zirconium (Zr), iron (Fe), cobalt (Co), and nickel (Ni). These elements have a deoxidization effect capable of removing an oxide film, which reduces wettability with copper, on the chromium surface, a property of wetting with copper easily, and a function of facilitating infiltration of copper into the sintered compact.

However, if the amount of blending thereof is less than 0.1 percent by mass, the effect of facilitating infiltration is not exerted. On the other hand, if the amount of blending exceeds 2.0 percent by mass, these elements are alloyed with copper during infiltration and, thereby, the thermal conductivity is deteriorated undesirably. Therefore, the total amount of blending of these elements is specified to be within the range of 0.1 percent by mass or more, and 2.0 percent by mass or less relative to the chromium powder.

In general, the above-described sintered compact containing Ti and the like is produced by molding and sintering a mixed powder in which predetermined amounts of Ti powder and the like are blended into the metal chromium powder. For example, it can also be produced by using a metal chromium powder plated with nickel as a material powder. Alternatively, a technology for preventing segregation may be applied, while the technology is known in iron based powder metallurgy, and the above-described sintered compact can also be produced by adhering Ti, Zr, Fe, Co, Ni, or the like uniformly on the surface of a metal chromium powder with a binder, followed by molding and sintering.

In the process shown in FIG. 6 (a), when the content of Cr exceeds 40 percent by mass, the material Cr powder is simply subjected to filling a mold in such a way as to leave voids, into which copper can infiltrate after sintering, because no copper powder is contained. An appropriate method may be selected as a means of the above-described filling a mold, in accordance with the characteristic value of the intended heat dissipation plate, and the method is not specifically limited.

The powder compact produced by the filling a mold is then subjected to a sintering step, so that a sintered compact is produced. The purpose of this sintering step is to remove an oxide film on the Cr powder surface and remaining oxygen, carbon, and the like, which are not adequately thermally decomposed during debinding step when a lubricant is added, and it is desirable that a skeleton structure of Cr is formed. Therefore, this sintering step must be performed by selecting an appropriate method in accordance with the characteristics of the metal chromium powder, which is a material powder, and furthermore, the means of the filling a mold.

The sintering process is not specifically limited as long as the above-described purpose is achieved. For example, it is adequate that the powder compact is kept in a hydrogen atmosphere or in a vacuum at 1,200° C. or higher, and 1,600° C. or lower, desirably 1,250° C. or higher, and 1,450° C. or lower, for about 30 minutes or more, and 300 minutes or less depending on the size of the powder compact.

Copper is infiltrated into the thus produced powder compact. This infiltration of copper is for the purpose of filling copper in between the skeleton, which has been formed before the sintering step and which is primarily composed of Cr, and thereby, providing a predetermined thermal conductivity to the alloy for heat dissipation. The amount of infiltration of copper is essentially determined based on the thermal conductivity and the like required of the alloy for heat dissipation. In general, it is recommended that copper is allowed to constitute 10 percent by mass or more, and 80 percent by mass or less in the alloy for heat dissipation, preferably 40 percent by mass or more, and 60 percent by mass or less.

A known method may be adopted as the means for infiltration. For example, adequate infiltration of copper can be performed by placing a pure copper plate or a pure copper powder on the upper surface, the lower surface, or the upper and lower surfaces of the sintered compact, and keeping in a vacuum or in a hydrogen atmosphere at within the range of 1,100° C. or higher, and 1,300° C. or lower, preferably 1,150° C. or higher, and 1,250° C. or lower, for 20 minutes or more, and 60 minutes or less. Alternatively, a powder compact or a sintered compact of copper can also be used in place of the pure copper plate or a pure copper powder.

An excess pure copper portion remaining on the surface of the infiltrated compact is removed by, for example, grinding work with a grindstone. Furthermore, the infiltrated compact is finished into the shape of a heat dissipation plate by machining or press work, a plating treatment is performed to adhere Ni having a thickness of 2 μm or more, and 8 μm or less and, thereafter, aging according to the present invention is performed.

As an example, a metal chromium powder having a particle size of 150 μm or less was naturally filled in an aluminum oxide container by gravitation, and this was kept in hydrogen at 1,500° C. for 60 min, so that a sintered compact was produced. An oxygen-free copper plate was placed on the upper surface of the resulting sintered compact, copper was infiltrated by being kept in a vacuum at 1,200° C. for 30 minutes and, thereafter, cooling was performed from 1,200° C. to 200° C. over 45 minutes (average cooling rate 22° C./min), so that an infiltrated compact of 150×150×4 mm composed of 52.5 percent by mass of Cr and 47.5 percent by mass of Cu was produced. A tabular specimen of 25×8×3 mm was cut from the resulting infiltrated compact, and was subjected to aging by being kept in hydrogen for 60 minutes at various temperatures. The resulting test pieces were subjected to a thermal expansion measurement, and the results thereof are shown in FIG. 7. As shown in FIG. 7, when the aging is performed at a temperature within the range of 500° C. or higher, and 600° C. or lower, the thermal expansion coefficient of the infiltrated compact is decreased and, thereby, the purpose of the present invention can be achieved. On the other hand, if the aging temperature is lower than 500° C. or higher than 600° C., the thermal expansion coefficient is increased sharply. It is estimated that Cr is secondarily precipitated in the phase B, in which Cr forms solid solution in Cu, due to aging having its center at 550° C., the thermal expansion coefficient is sharply decreased, the thermal expansion coefficient of the entire infiltrated compact including the metal chromium phase A is thereby decreased and, as a result, the above-described phenomenon occurs.

As described above, the phenomenon, in which the thermal expansion coefficient decreases sharply by the aging at a temperature within the range of 500° C. or more, and 600° C. or less, in particular the aging having its center at 550° C., is observed in a Cu—Cr alloy in which chromium within the range of 0.3 percent by mass or more, and 10 percent by mass or less forms a solid solution after infiltration or solution heat treatment. In the present invention, this phenomenon is used and, thereby, the thermal expansion coefficient of the entire infiltrated compact including the metal chromium phase A is decreased.

In this regard, the above-described aging is essentially different from, for example, the aging at 450° C. or higher, and 500° C. or lower adopted to increase the hardness of a Cu—Cr alloy to be used as an electrode material for welding, and the temperature is higher by 50° C. to 100° C. In the present invention, when about 0.3 to 1.5 percent by mass of chromium forms a solid solution in the phase B, metal chromium is secondarily precipitated by the aging and, therefore, the purpose of the present invention can be achieved.

When the Cu—Cr alloy is subjected to aging within the range of 450° C. or higher, and 500° C. or lower, the hardness can be increased by using the GP zone, which is precipitated at an atomic level. However, in the present invention, a so-called over aging state, in which metal chromium phases on the order of several tens of nanometers are precipitated, is brought about by the aging within the range of 500° C. or higher, and 750° C. or lower and, as a result, it is estimated that the thermal expansion is suppressed by the secondary precipitation (solid phase precipitation after solidification) of Cr particles on the order of several tens of nanometers thereby precipitated.

As described above, the aging of the present invention is an operation in which Cr is allowed to form a solid solution in the solid phase and, thereafter, the metal chromium phase on the order of several tens of nanometers is secondarily precipitated by the aging. Therefore, it is important as a precondition that a predetermined amount of chromium forms a solid solution in the solid phase. In general, this condition can be achieved in the infiltration operation of copper. However, for example, if the sintered compact is cooled extremely slowly after the infiltration, most of the chromium component once formed into a solid solution during the infiltration may grow to Cr particles of submicron size or larger, and the above-described condition may not be satisfied. Therefore, in order to secondarily precipitate Cr reliably, it is preferable to perform solution heat treatment at 900° C. or higher, and 1,050° C. or lower before aging so as to allow the Cr component to form a solid solution in the phase B. In this manner, the content of the Cr component, which is secondarily precipitated, can become reliably within the range of about 0.3 percent by mass to 1.5 percent by mass in the stage before aging.

The content of the chromium component before aging can be measured by an analysis means, e.g., EPMA (Electron Probe Micro Analyzer). Furthermore, the relationship between the infiltration condition, the solution heat treatment condition, and the like and the above-described content of the chromium component is analyzed and, thereby, a desired chromium content in accordance with the thermal conductivity required of the alloy for heat dissipation can be attained.

By the above-described aging, the thermal expansion coefficient of the alloy for heat dissipation composed of a Cu—Cr metal-metal based composite material, which is the object of the present invention, can be controlled at a low value. The alloy for heat dissipation is required to have a large thermal conductivity besides a low thermal expansion coefficient value. The above-described condition can be primarily controlled by the amount of secondary precipitation, that is, the amount of infiltration of copper in the Cu—Cr sintered compact. However, the condition is achieved by maximization of the thermal conductivity through the above-described aging in combination with that described above.

With respect to the Cu—Cr alloy for filling in between primary phases, that is phase A of the metal chromium, the thermal conductivity thereof before the aging is small due to solid solution chromium. However, after the aging of the present invention is performed, Cr is in the state of being precipitated as a metal chromium phase, the state in which the metal chromium phase is dispersed in the copper matrix is brought about, and the thermal conductivity of the purified copper matrix is maximized. In this manner, with respect to the entire alloy for heat dissipation, an extremely high thermal conductivity can be attained.

The work strain is provided by the copper removal work after the infiltration, cutting work, press work, and the like. Consequently, a decrease in thermal conductivity, and by extension, a reduction in thermal conductivity of the entire alloy for heat dissipation occurs. However, since the work strain is also removed by the above-described aging. Therefore, in the present invention, the reduction in thermal conductivity caused by them is prevented and the characteristics inherent to copper can be drawn adequately.

With respect to the thermal conductivity and the electrical conductivity, there is a Wiedemann-Franz law, that is, a law which states that the ratio of the thermal conductivity to the electrical conductivity of a metal is equal to multiply the absolute temperature by a constant independent of the type of metal. Therefore, it is possible to control the characteristics of the product by measuring the electrical conductivity in place of the measurement of the thermal conductivity.

The above-described basic form of the present invention has been described following the process shown in FIG. 6 (a). However, the present invention is not limited to the above-described process, and can also be applied to alloys for heat dissipation composed of Cu—Cr based metal-metal composite materials produced by other techniques as long as the aging is performed so as to precipitate the metal chromium phase. The embodiments in these cases will be described below.

FIG. 6 (b) shows a process in which a mixed powder of a metal chromium powder and a copper powder is used as a material powder, and the mixed powder is pressed and sintered. In this case, since a sintered compact, in which copper is filled in between the phases A composed of Cr, can be obtained at that point in time when the sintering step is finished, a heat dissipation plate containing relatively high content of Cu composition, for example, containing more than 3 percent by mass, and 40 percent by mass or less of Cr, can be produced relatively easily.

In this case, it is preferable that MIM (Metal Injection Molding) is used for the compaction molding of the mixed powder, besides common powder molding methods in which, for example, a powder is filled in a mold and is pressurized. Furthermore, it is also possible to perform a HIP (Hot Isostatic Pressing) treatment after the powder compact is sintered. Alternatively, a mixed powder of a metal chromium powder and a copper powder may be filled in a heat-resistant container formed from alumina or the like, and a sintering treatment may be performed in a hydrogen atmosphere or in a vacuum at a temperature within the range of 850° C. or higher, and 1,080° C. or lower for 30 minutes or more, and 300 minutes or less depending on the size of the powder compact without pressing in a mold.

In this case, the metal chromium powder may be the same as that used in the above-described basic process shown in FIG. 6 (a), or be prepared by adhering titanium or the like to the metal chromium powder according to the above-described technique. On the other hand, it is preferable that an electrolytic or atomized powder having a powder size of 150 μm or less is used as the copper powder.

In the above-described case, the copper infiltration step is not required in principle. However, in the case where, for example, a mixed powder of a metal chromium powder and a copper powder is filled in a heat-resistant container formed from alumina or the like, and a sintering treatment is performed without pressing in a mold, the resulting sintered compact may be further subjected to copper infiltration so as to remove voids between chromium phases A, improve the state of filling of the copper alloy and, thereby, improve the thermal conductivity.

As shown in the basic process, the thus produced sintered compact is finished into the shape of a heat dissipation plate by machining or press work, a plating treatment is performed to adhere nickel having a thickness of 2 μm or more, and 8 μm or less and, thereafter, aging according to the present invention is performed. In the case where the infiltration is performed, a working step of removing an excess pure copper portion remaining on the surface of the infiltrated compact is performed, as a matter of course.

EXAMPLE 3

Figure 5:
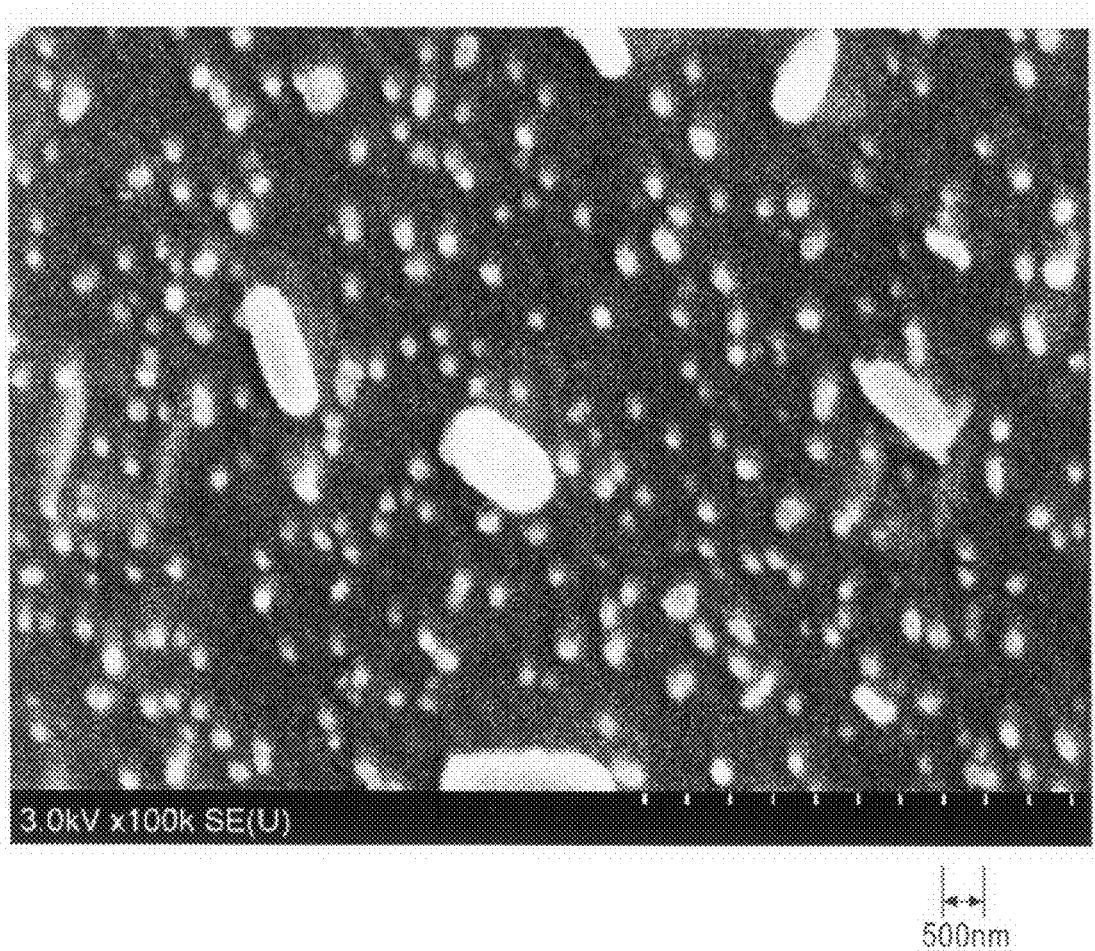
FIG. 5 is a photograph showing a cross section of another alloy for heat dissipation according to the present invention.

FIG. 5 shows a SEM (scanning electron microscope) photograph of a microstructure heat-treated at 550° C. among the alloys for heat dissipation produced by the above-described method shown in FIG. 6 (a). As is clear from FIG. 5, chromium particles of several tens of nanometers secondarily precipitated in a copper phase B by the aging and chromium particles having a large major axis (more than 100 nm) primarily crystallized during solidification of the phase B after the infiltration are observed. The average particle diameter of the secondarily precipitated chromium is 22 nm (nanometer), the precipitation density is 170 particles/μm$^2$, and the aspect ratio is 4.1 at the maximum and 1.6 on the average. The apparatus and the various conditions for taking this photograph are similar to the apparatus and the various conditions used in FIG. 3. The precipitation size of chromium is at a nanometer level as in FIG. 3, and it is estimated that the thermal expansion is reduced for the same principle.

A disk-shaped test piece having a diameter of 10 mm and a thickness of 3 mm for measuring the thermal conductivity, a tabular test piece having a length of 25 mm, a width of 8 mm, and a thickness of 3 mm for measuring the thermal expansion coefficient measurement, and a square tabular test piece having a side of 30 mm and a thickness of 3 mm for measuring the electrical conductivity were cut from the resulting tabular material. Each of these test pieces were subjected to aging while being kept in hydrogen at 550° C. for 60 minutes. Thereafter, the density, the thermal expansion coefficient, the thermal conductivity, and the electrical conductivity were measured. The density was determined by an Archimedes method, the thermal expansion coefficient was determined from the elongation of the test piece in the longitudinal direction, and the thermal conductivity was determined by a laser flash method.

The electrical conductivity was measured with an electrical conductivity meter (SIGMATEST D2.068 produced by FOERSTER JAPAN Limited). The electrical conductivity was measured before and after the aging. The measurement results are shown in Table 2-1 and Table 2-2. Invention example 13, which is a heat dissipation plate for a semiconductor according to the present invention, has an excellent thermal expansion coefficient value of $10.7\times10^{-6}$/K and an excellent thermal conductivity value of 183 W/(m·K). In the table, the unit "% IACS" of the electrical conductivity is expressed based on the International Annealed Copper Standard, and 100% IACS corresponds to 58 MS/m.

Aside from them, it was checked whether a semiconductor element was able to be joined by soldering to the heat dissipation plate for a semiconductor without problem. For that purpose, four holes having a diameter of 5 mm were made in the test piece (100×100×3 mm) with a drilling press, and electrolytic nickel plating having a thickness of 5 μm was applied. Thereafter, the test piece was aged by being kept in hydrogen at a temperature of 550° C. for 60 minutes. Subsequently, four aluminum nitride plates of 15×15×2 mm were soldered. As a result, the plating portion had no problem nor occurred harmful warpage. Therefore, it was ascertained that soldering was able to be performed satisfactorily.

Forty percent by mass of metal chromium powder (purity 99 percent by mass or more) having a particle size of 45 µm or less and 60 percent by mass of pure copper powder having a particle size of 63 µm or less were mixed, the resulting mixed powder was filled in a rubber mold, and was molded by application of a pressure of 5 t/cm² with CIP. The resulting powder compact was sintered by being kept in hydrogen at a temperature of 1,050° C. for 80 minutes. An oxygen-free copper plate was placed on the resulting sintered compact, copper was infiltrated by being kept in hydrogen at a temperature of 1,200° C. for 30 minutes, so that an infiltrated compact was produced. The resulting infiltrated compact was treated as in Invention example 13, and the density, the thermal expansion coefficient, the thermal conductivity, and the electrical conductivity were measured.

Figure 8:
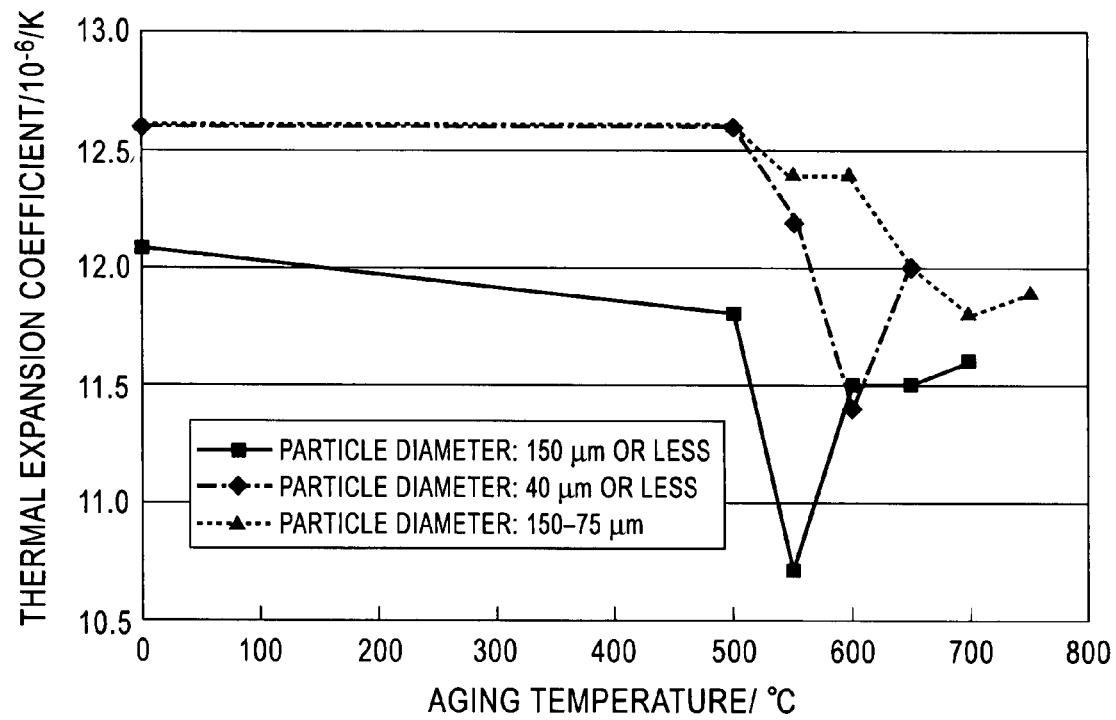
FIG. 8 is a diagram showing an influence of the particle size of chromium on the thermal expansion coefficient and the thermal conductivity when the particle size is changed in the present invention.

The results are collectively shown in Table 1. Invention example 28, which is an alloy for heat dissipation according to the present invention, has an excellent thermal expansion coefficient value of 12.9×10⁻⁶/K and an excellent thermal conductivity value of 220 W/(m·K). In this case as well, a heat dissipation test was performed as in Example 3. The plating portion had no problem nor occurred harmful warpage.

temperatures, and the thermal expansion coefficients were measured. The other conditions were similar to those in the above-described Examples. FIG. 8 shows the relationship between the aging temperature and the thermal expansion coefficient. In every alloy adopting any one of the particle diameters, the thermal expansion coefficient is decreased.

Figure 9:
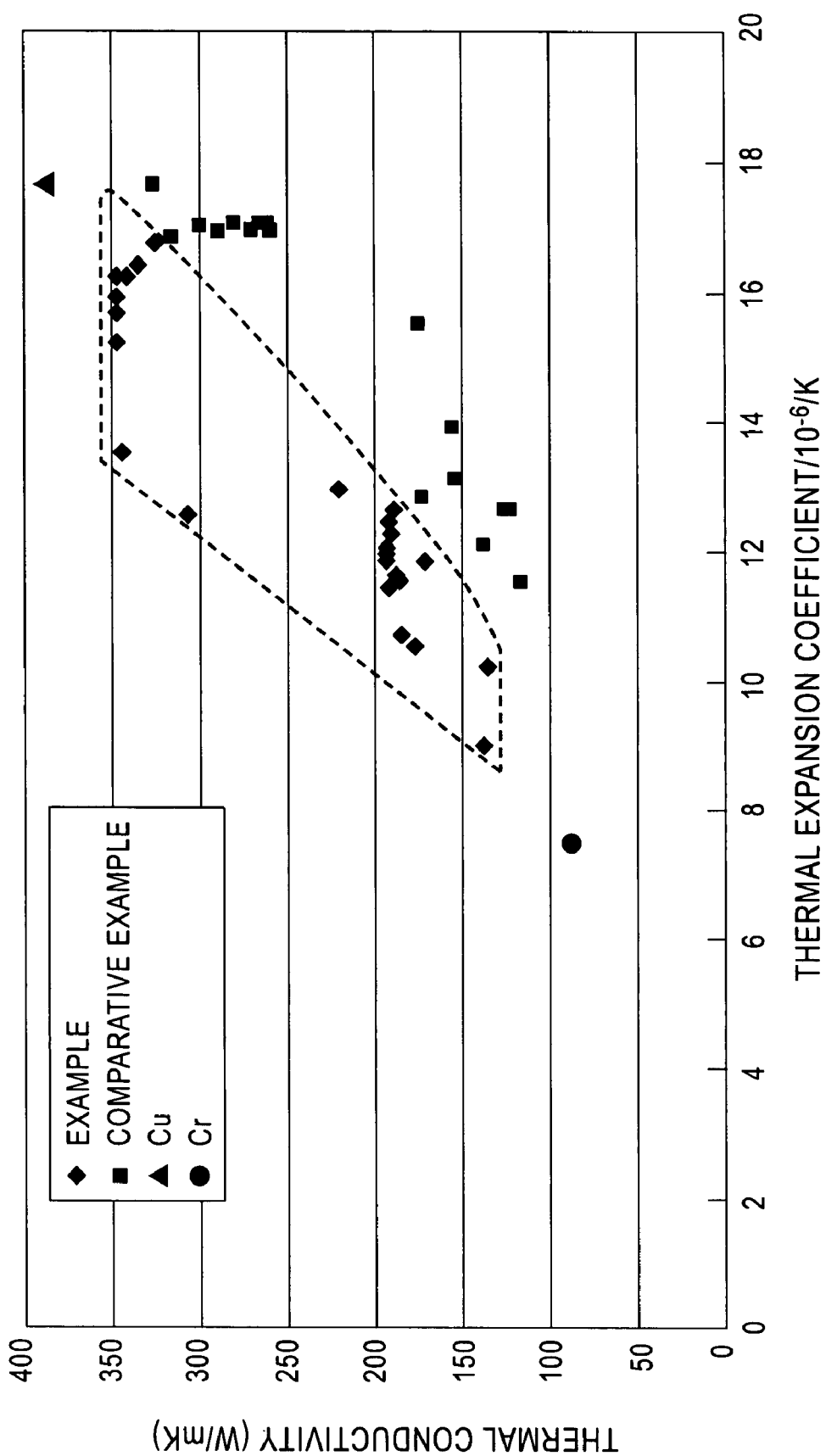
FIG. 9 is a diagram showing the relationship between the thermal expansion coefficient and the thermal conductivity of a Cu—Cr alloy according to the present invention.

The results of the above-described Examples are collectively shown in Table 2-1, Table 2-2, and FIG. 9. FIG. 9 shows the relationship between the thermal expansion and the thermal conduction of alloys having different Cu and Cr components. In FIG. 9, square points on the right side indicate the relationship between the thermal expansion and the thermal conduction before aging and after the aging at 450° C. or lower. The relationship after the aging at 500° C. is within the range indicated by the dotted line. When the aging according to the present invention was performed, even if the thermal conductivity was the same, alloys having significantly low thermal expansion coefficients were produced. From this diagram, it is clear that the manufacturing method according to the present invention decreases the thermal expansion coefficient even when the thermal conductivity is the same.

INDUSTRIAL APPLICABILITY

The Cu—Cr alloy according to the present invention allows a favorable high thermal conductivity and a favorable

TABLE 1

| Invention example | Composition (mass %) | Density (g/cm³) | Thermal expansion coefficient (×10⁻⁶/K) | Thermal conductivity (W/(m·K)) | Electrical conductivity (% IACS) Before aging | Electrical conductivity (% IACS) After aging |
|---|---|---|---|---|---|---|
| 13 | Cr: 52.5 Cu: 47.5 | 8.02 | 10.7 | 183 | 31.1 | 42.2 |
| 28 | Cr: 39.2 Cu: 60.8 | 8.17 | 12.9 | 220 | 35.5 | 50.9 |

EXAMPLE 4

In the case where the present invention was carried out in the process shown in FIG. 6 (a), in order to check the influence of the particle diameter of the powder, three types, that is, 150 µm or less, 40 µm or less, and 75 to 150 µm, of Cr powders were sintered, and infiltration was performed, so that alloys were produced. Aging was performed at various aging low thermal expansion coefficient to become compatible with each other, and can be produced more economically as compared with a known tungsten-copper based or molybdenum-copper based heat dissipation material. Furthermore, uniform plating can be performed and excellent machinability is exhibited. Therefore, the Cu—Cr alloy according to the present invention has great value in industrial use as, in particular, an alloy for heat dissipation to be used for semiconductor device.

TABLE 2-1

Figure 7:
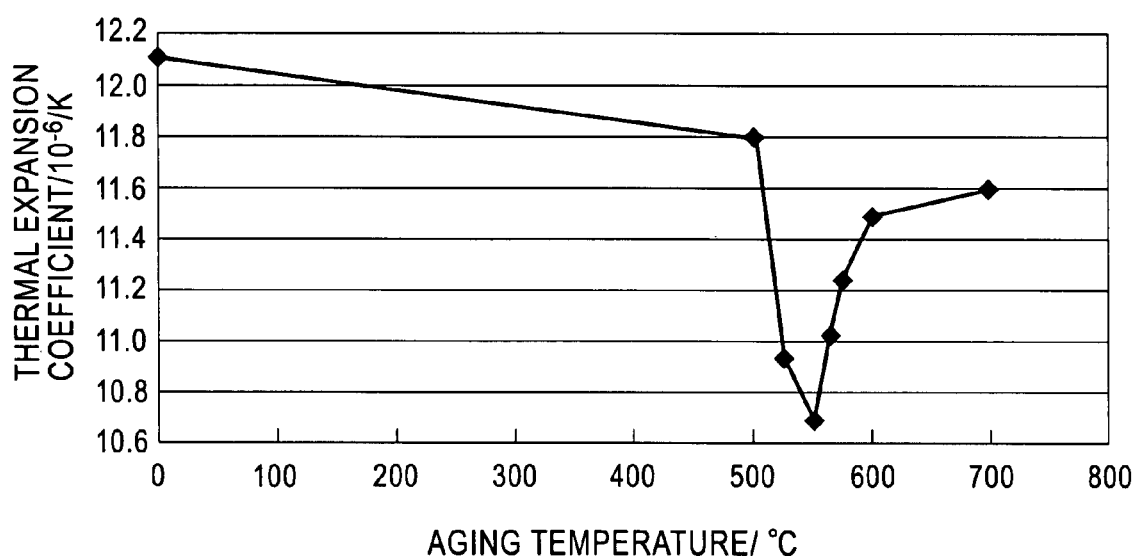
FIG. 7 is a diagram showing the relationship between the aging temperature and the thermal expansion coefficient when an infiltrated compact composed of 52.5 percent by mass of Cr and 47.5 percent by mass of Cu is aged at various temperatures.

|  |  | Cr content (mass %) | Manufacturing method* | Average cooling rate after infiltration (° C./min) | Aging temperature (° C.) | Density (g/cm3) | Thermal conductivity (W/m/K) | Thermal expansion coefficient (×10-6/K) | Precipitation density (particles/µm2) | Maximum aspect ratio | Hardness Hv | Remarks |
|---|---|---|---|---|---|---|---|---|---|---|---|---|
| Invention example | 1 | 1.1 | casting and rolling | 30 | 500° C. | 8.89 | 345 | 16.2 | 60 | 3.1 | 65 | FIGS. 2♦, 4♦ |
|  | 2 |  |  |  | 550° C. |  | 345 | 13.5 | 75 | 5.6 | 61 | FIGS. 2♦, 3, 4♦ |
|  | 3 |  |  |  | 600° C. |  | 347 | 15.2 | 60 | 3.2 | 62 | FIGS. 2♦, 4♦ |
|  | 4 |  |  |  | 650° C. |  | 347 | 15.9 | 28 | 2.3 | 61 | FIGS. 2♦, 4♦ |
|  | 5 |  |  | 600 | 500° C. |  | 325 | 16.7 | 65 | 2.8 | 135 | FIGS. 2■, 4■ |
|  | 6 |  |  |  | 550° C. |  | 335 | 16.4 | 150 | 3.7 | 106 | FIGS. 2♦, 4♦ |
|  | 7 |  |  |  | 600° C. |  | 340 | 16.2 | 250 | 4.3 | 91 | FIGS. 2♦, 4♦ |
|  | 8 |  |  |  | 650° C. |  | 346 | 15.6 | 80 | 3.8 | 78 | FIGS. 2♦, 4♦ |
|  | 9 |  |  |  | 700° C. |  | 347 | 16.2 | 40 | 3.1 | 70 | FIGS. 2♦, 4♦ |
|  | 10 | 63 | mix sintering 150 µm or less | 22 | 550° C. | 7.76 | 134 | 10.2 | 99 | 4.6 |  |  |
|  | 11 |  |  |  | 600° C. |  | 136 | 9 | 148 | 5.8 |  |  |
|  | 12 | 52.5 | infiltration | 22 | 500° C. | 8.02 | 170 | 11.8 | 20 | 3.8 |  | FIGS. 7, 8■ |

TABLE 2-1-continued

| | Cr content (mass %) | Manu-facturing method* | Average cooling rate after infiltration (° C./min) | Aging temperature (° C.) | Density (g/cm3) | Thermal conductivity (W/m/K) | Thermal expansion coefficient (×10-6/K) | Precipitation density (particles/μm2) | Maximum aspect ratio | Hardness Hv | Remarks |
|---|---|---|---|---|---|---|---|---|---|---|---|
| 13 | | 150 μm or less | | 550° C. | | 183 | 10.7 | 170 | 5.7 | | FIGS. 5, 7, 8■ |
| 14 | | | | 600° C. | | 184 | 11.5 | 60 | 3.6 | | FIGS. 7, 8■ |
| 15 | | | | 650° C. | | 185 | 11.5 | 30 | 2.5 | | FIGS. 7, 8■ |
| 16 | | | | 700° C. | | 186 | 11.6 | 22 | 2.4 | | FIGS. 7, 8■ |
| 17 | 49 | infiltration 150 μm or less | 5 | 610° C. | 8 | 176 | 10.5 | 105 | 4.8 | | |
| 18 | 46.5 | infiltration 150 to 75 μm | 22 | 500° C. | 8.04 | 189 | 12.6 | 23 | 3 | | FIG. 8♦ |
| 19 | | | | 550° C. | | 190 | 12.2 | 38 | 3.4 | | FIG. 8♦ |
| 20 | | | | 600° C. | | 191 | 11.4 | 64 | 4.3 | | FIG. 8♦ |
| 21 | | | | 650° C. | | 191 | 12 | 41 | 3.7 | | FIG. 8♦ |
| 22 | 43.5 | infiltration 40 μm or less | 22 | 500° C. | 8.09 | 187 | 12.6 | 24 | 3.1 | | FIG. 8▲ |
| 23 | | | | 550° C. | | 190 | 12.4 | 35 | 3.5 | | FIG. 8▲ |
| 24 | | | | 600° C. | | 192 | 12.4 | 48 | 3.8 | | FIG. 8▲ |
| 25 | | | | 650° C. | | 193 | 12 | 60 | 4.2 | | FIG. 8▲ |
| 26 | | | | 700° C. | | 193 | 11.8 | 74 | 4.7 | | FIG. 8▲ |
| 27 | | | | 750° C. | | 193 | 11.9 | 62 | 4.3 | | FIG. 8▲ |
| 28 | 39.2 | mix sintering 44 μm or less | 22 | 550° C. | 8.17 | 220 | 12.9 | 56 | 4.7 | | |
| 29 | 15 | infiltration 150 μm or less | 30 | 550° C. | 8.69 | 307 | 12.5 | 45 | 3.6 | | |

*Each numerical number indicates an opening of a sieve to adjust the particle size of the powder used in a powder metallurgy method.

TABLE 2-2

| | | Cr content (mass %) | Manu-facturing method* | Average cooling rate after infiltration (° C./min) | Aging temperature (° C.) | Density (g/cm3) | Thermal conductivity (W/m/K) | Thermal expansion coefficient (×10-6/K) | Precipitation density (particles/μm2) | Maximum aspect ratio | Hardness Hv | Remarks |
|---|---|---|---|---|---|---|---|---|---|---|---|---|
| Comparative example | 1 | 1.1 | casting and rolling | | before solution treatment | 8.89 | 325 | 17.6 | 11 | 2.1 | | |
| | 2 | | | 30 | before aging | | 259 | 16.9 | 3 | 1.7 | 51 | FIGS. 2♦, 4♦ |
| | 3 | | | | 300° C. | | 270 | 16.9 | 3 | 1.8 | 60 | FIGS. 2♦, 4♦ |
| | 4 | | | | 400° C. | | 290 | 16.9 | 5 | 2 | 65 | FIGS. 2♦, 4♦ |
| | 5 | | | | 450° C. | | 315 | 16.8 | 15 | 2.3 | 66 | FIGS. 2♦, 4♦ |
| | 6 | | | 600 | before aging | | 260 | 17 | 2 | 1.4 | 53 | FIGS. 2■, 4■ |
| | 7 | | | | 300° C. | | 265 | 17 | 3 | 1.5 | 64 | FIGS. 2■, 4■ |
| | 8 | | | | 400° C. | | 280 | 17 | 6 | 1.7 | 90 | FIGS. 2■, 4■ |
| | 9 | | | | 450° C. | | 300 | 17 | 18 | 2 | 120 | FIGS. 2■, 4■ |
| | 10 | 63 | mix sintering 150 μm or less | 22 | before aging | 7.76 | 115 | 11.5 | 4 | 4.2 | | |
| | 11 | 52.5 | infiltration 150 μm or less | 22 | before aging | 8.02 | 136 | 12.1 | 6 | 5.4 | | FIGS. 7, 8■ |
| | 12 | 46.5 | infiltration 150 to 75 μm | 22 | before aging | 8.04 | 124 | 12.6 | 5 | 2.5 | | FIG. 8♦ |
| | 13 | | | | 425° C. | | 154 | 13.1 | 8 | 2.8 | | FIG. 8♦ |
| | 14 | 43.5 | infiltration 40 μm or less | 22 | before aging | 8.09 | 121 | 12.6 | 4 | 2.3 | | FIG. 8▲ |
| | 15 | | | | 450° C. | | 172 | 12.8 | 12 | 2.7 | | FIG. 8▲ |
| | 16 | 39.2 | mix sintering 44 μm or less | 22 | before aging | 8.17 | 155 | 13.9 | 3 | 2.4 | | |
| | 17 | 15 | mix sintering 150 μm or less | 30 | before aging | 8.69 | 174 | 15.5 | 2 | 2.1 | | |

*Each numerical number indicates an opening of a sieve to adjust the particle size of the powder used in a powder metallurgy method.

The invention claimed is:

1. A Cu—Cr alloy comprising more than 3 percent by mass and 40 percent by mass or less of Cr and the remainder of Cu and incidental impurities and comprising a structure in which particulate Cr phases having a major axis of 100 nm or less and an aspect ratio of less than 10 are precipitated at a density of 20 particles/$\mu m^2$ or more in a Cu matrix except Cr phases of more than 100 nm.

2. The Cu—Cr alloy according to claim 1, wherein the alloy has been worked into a predetermined shape by a melting method or a powder metallurgy method, subjected to infiltration and/or a solution heat treatment, cooled at a cooling rate of 30° C./min or less, and subjected to aging at a range of 500° C. or higher, and 750° C. or lower.

3. The Cu—Cr alloy according to claim 1, wherein the alloy has been molded into a predetermined shape by a powder metallurgy method, cooled at a cooling rate of 30° C./min or less after being subjected to a sintering treatment in the powder metallurgy method, and subjected to aging at a range of 500° C. or higher, and 750° C. or lower.

4. The Cu—Cr alloy according to claim 2, characterized in that it has been subjected to a solution heat treatment at a temperature within the range of 900° C. or higher, and 1,050° C. or lower.

5. A member for heat dissipation comprising the Cu—Cr alloy according to any one of claim 1, 2, 3, or 4.

6. A Cu—Cr alloy comprising more than 40 percent by mass and 80 percent by mass or less of Cr and the remainder of Cu and incidental impurities and comprising a structure in which particulate Cr phases having a major axis of 100 nm or less and an aspect ratio of less than 10 are precipitated at a density of 20 particles/$\mu m^2$ or more in a Cu matrix except Cr phases of more than 100 nm.

7. The Cu—Cr alloy according to claim 6, wherein the alloy has been worked into a predetermined shape by a melting method or a powder metallurgy method, subjected to infiltration and/or a solution heat treatment, cooled at a cooling rate of 30° C./min or less, and subjected to aging at a range of 500° C. or higher, and 750° C. or lower.

8. The Cu—Cr alloy according to claim 6, wherein the alloy has been molded into a predetermined shape by a powder metallurgy method, cooled at a cooling rate of 30° C./min or less after being subjected to a sintering treatment in the powder metallurgy method, and subjected to aging at a range of 500° C. or higher, and 750° C. or lower.

9. The Cu—Cr alloy according to claim 7, characterized in that it has been subjected to a solution heat treatment at a temperature within the range of 900° C. or higher, and 1,050° C. or lower.

10. A member for heat dissipation comprising the Cu—Cr alloy according to any one of claim 6, 7, 8, or 9.

* * * * *